United States Patent
Rozen et al.

(10) Patent No.: US 8,049,550 B2
(45) Date of Patent: Nov. 1, 2011

(54) METHOD FOR POWER REDUCTION AND A DEVICE HAVING POWER REDUCTION CAPABILITIES

(75) Inventors: Anton Rozen, Gedera (IL); Dan Kuzmin, Givat Shmuel (IL); Michael Priel, Hertzelia (IL)

(73) Assignee: Freescale Semiconductor, Inc., Austin, TX (US)

( * ) Notice: Subject to any disclaimer, the term of this patent is extended or adjusted under 35 U.S.C. 154(b) by 207 days.

(21) Appl. No.: 12/208,145

(22) Filed: Sep. 10, 2008

(65) Prior Publication Data

US 2010/0060342 A1 Mar. 11, 2010

(51) Int. Cl.
*G05F 1/10* (2006.01)
(52) U.S. Cl. .............. 327/535; 327/419; 331/2; 331/57
(58) Field of Classification Search ............. 331/2, 57; 327/419, 535
See application file for complete search history.

(56) References Cited

U.S. PATENT DOCUMENTS

| | | | | |
|---|---|---|---|---|
| 7,250,807 B1* | 7/2007 | Doyle | ............... | 327/534 |
| 7,282,975 B2* | 10/2007 | Burton et al. | ............... | 327/161 |
| 7,400,175 B2 | 7/2008 | Fallah et al. | | |
| 7,453,311 B1* | 11/2008 | Hart et al. | ............... | 327/534 |
| 7,564,274 B2* | 7/2009 | Hughes | ............... | 327/108 |
| 7,592,876 B2* | 9/2009 | Newman | ............... | 331/57 |
| 2002/0116440 A1 | 8/2002 | Cohn et al. | | |
| 2005/0194592 A1* | 9/2005 | Mair et al. | ............... | 257/49 |
| 2006/0232321 A1 | 10/2006 | Chuang et al. | | |
| 2006/0277509 A1 | 12/2006 | Tung et al. | | |
| 2007/0200617 A1 | 8/2007 | Kumar | | |
| 2008/0162770 A1* | 7/2008 | Titiano et al. | ............... | 710/309 |

OTHER PUBLICATIONS

Ikenaga, Yoshifumi, "Employ supply voltage control to save energy," EE Times-Asia, www.eetasia.com, Aug. 1-15, 2007, 2 pages.

\* cited by examiner

*Primary Examiner* — Arnold Kinkead
*Assistant Examiner* — Richard Tan

(57) ABSTRACT

A device that includes: (i) an evaluated circuit; (ii) a leakage current dependent oscillator configured to generate an oscillating signal that has an oscillating frequency that represents a leakage current of the evaluated circuit; (iii) a switching current dependent oscillator configured to generate an oscillating signal that has an oscillating frequency that represents a switching induced current of the evaluated circuit; (iv) a power reduction module that is configured to: (a) compare between an oscillation frequency of the leakage current dependent oscillator and an oscillation frequency of the switching current dependent oscillator, to provide a current comparison result; (b) select a power reduction technique out of a dynamic voltage and frequency scaling technique and a power gating technique in view of the current comparison result; and (c) apply the selected power reduction technique.

18 Claims, 10 Drawing Sheets

330

METHOD FOR POWER REDUCTION AND A DEVICE HAVING POWER REDUCTION CAPABILITIES

FIELD OF THE INVENTION

The present invention relates to a method for power reduction and a device having power reduction capabilities.

BACKGROUND OF THE INVENTION

In modern wireless devices one of the most important figures of merit is power consumption and, consequently, operation time. In order to reduce power consumption, device defines low-power states.

The power consumption of a circuit includes leakage power and switching power. Leakage power is attributed to leakage current that flows through semiconductors components (such as transistors, diodes, and the like) while switching power is attributed to switching activities of these semiconductor components.

Power gating technique involves operating a circuit (such as a processor) at a maximal frequency and a maximal supply voltage level during activation periods and shutting down the circuit during deactivation periods.

FIG. 1 illustrates a power consumption of a circuit that executes a task when a power gating technique is applied. During activation period 20 the circuit receives maximal voltage supply and clock signal of maximal frequency. Its power consumption includes leakage power consumption (box 12) and dynamic power consumption (box 14). During deactivation period 21 the circuit is shut down and does not consume any power. The sum of deactivation period 21 and activation period 20 is referred to as task period 22.

The overall power consumption of the circuit is illustrated by step-shaped curve 16 and is equal to: [DP(Vmax)+LP]*(Ta/Tt); wherein DP(Vmax) is the dynamic power consumption of the circuit when a maximal voltage (Vmax) is supplied to the circuit, LP is the leakage power consumption, Ta is the duration of activation period 20 and Tt is the duration of task period 22.

FIG. 2 illustrates a power consumption of a circuit that executes a task when a dynamic voltage and frequency scaling technique is applied. During task period 22 the circuit receives a voltage supply (Vs) that is lower than Vmax and receives clock signal of a frequency (Fc) that is lower than the maximal frequency. Its power consumption during task period 22 includes leakage power consumption (box 32) and dynamic power consumption (box 34). Task period 22 is followed by idle period 40 during which the circuit consumes leakage power 32.

The overall power consumption of the circuit is illustrated by step-shaped curve 36 and is equal to: [DP(Vs)+LP]*Tt; wherein DP(Vs) is the dynamic power consumption of the circuit when a voltage (Vs, Vs<<Vmax) is supplied to the circuit, LP is the leakage power consumption, and Tt is the duration of task period 22.

The leakage power depends on the temperature of the circuit and is hard to predict. Accordingly, selecting between these mentioned above power reduction technique is not accurate. In addition, direct measurements of the leakage current of a circuit and its switching current requires to temporarily stop the execution of circuit normal tasks and allocating time for current measurements.

SUMMARY OF THE PRESENT INVENTION

The present invention provides a method and a device as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects, and embodiments of the invention will be described, by way of example only, with reference to the drawings.

DETAILED DESCRIPTION OF THE DRAWINGS

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

It has been shown that the oscillating frequencies of a leakage current dependent oscillator and of a switching current dependent oscillator can assist in selecting between applying a DVFS technique, a power gating technique of a combination thereof.

Figure 1:
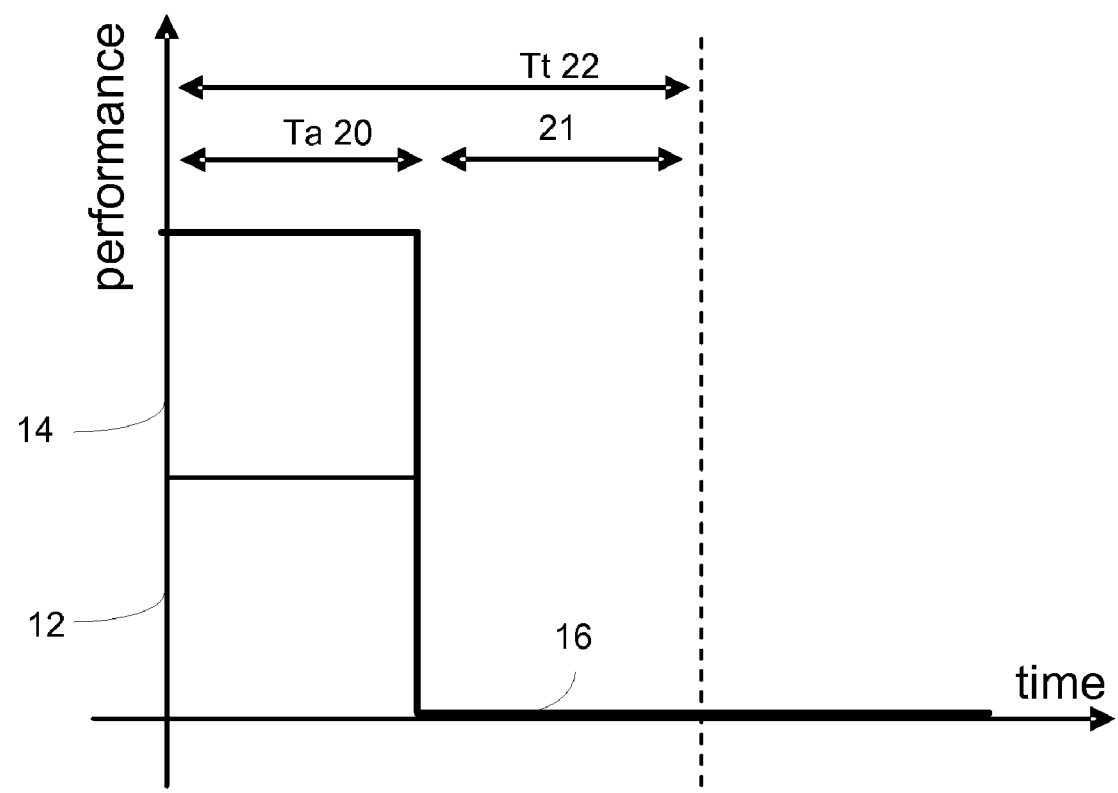
FIG. 1 schematically shows an example of a power consumption of a circuit.
Figure 2:
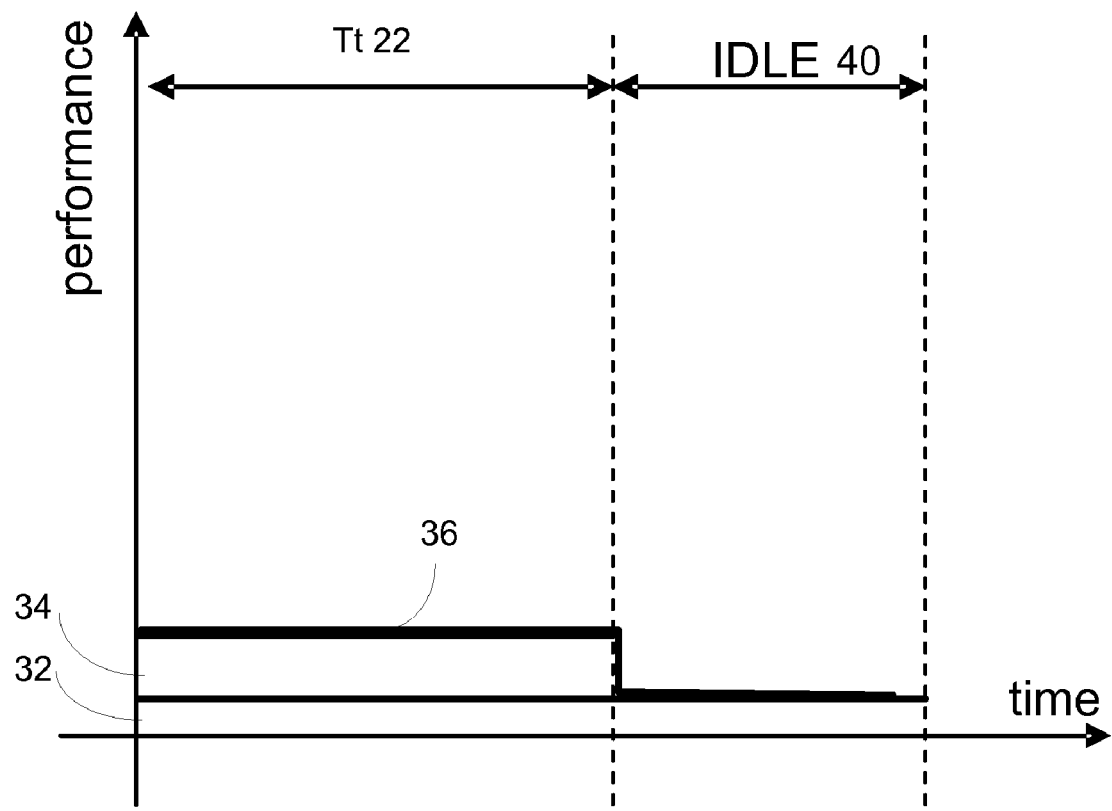
FIG. 2 schematically shows an example of a power consumption of a circuit.
Figure 3:
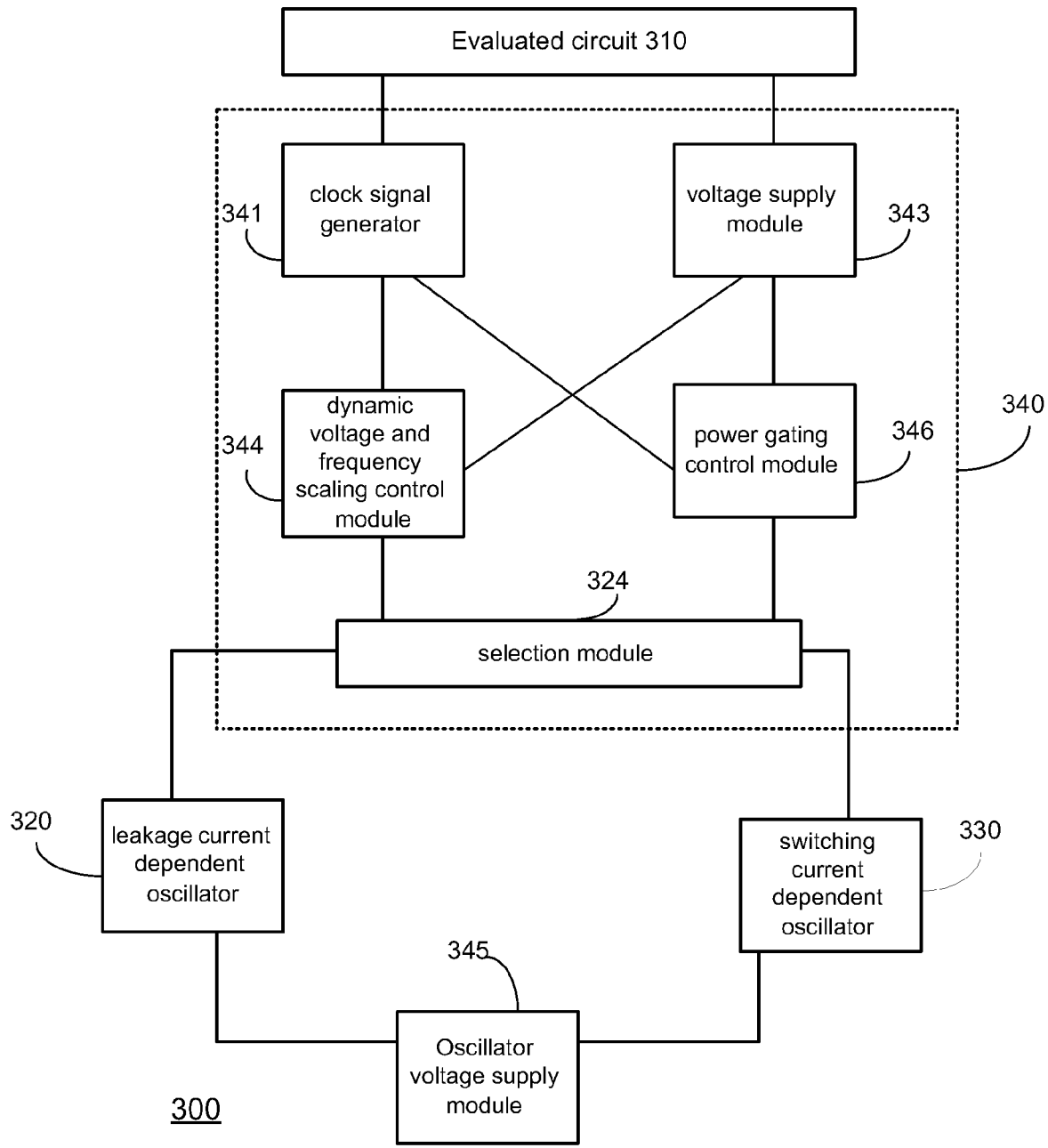
FIG. 3 schematically shows an example of an embodiment of a device.

FIG. 3 schematically shows an example of an embodiment of device 300.

Device 300 includes: (i) evaluated circuit 310; (ii) leakage current dependent oscillator 320 that is configured to generate an oscillating signal that has an oscillating frequency that represents a leakage current of evaluated circuit 310; (iii) switching current dependent oscillator 330 configured to generate an oscillating signal that has an oscillating frequency that represents a switching induced current of evaluated circuit 310; and (iv) power reduction module 340 that is configured to: (a) compare between an oscillation frequency of the leakage current dependent oscillator and an oscillation frequency of the switching current dependent oscillator, to provide a current comparison result; (b) select a power reduction technique out of a dynamic voltage and frequency scaling technique and a power gating technique in view of the current comparison result; and (c) apply the selected power reduction technique.

Power reduction module 340 includes selection module 342, dynamic voltage and frequency scaling (DVFS) control module 344, power gating control module 346, clock signal generator 341, voltage supply module 343, and oscillator voltage supply module 345.

Selection module 342 receives the output signals of leakage current dependent oscillator 320 and switching current dependent oscillator 330 (or information represented thereof) and selects which power reduction technique to apply. It sends a selection indication to DVFS control module 344 and to power gating control module 346. DVFS control module 344 can apply DVFS technique while power gating module 346 can apply power gating. Both control modules 346 and 344 control clock signal generator 341, voltage supply module 343.

Voltage supply module 343 provides a supply voltage to evaluated circuit 310 while oscillator voltage supply module 345 provides a supply voltage to leakage current dependent oscillator 320 and to switching current dependent oscillator 330. Accordingly, the supply voltage that is supplied by oscillator voltage supply module 345 can be changed without affecting evaluated circuit 310.

Power reduction module 340 (and especially selection module 342) an determine a level of a voltage supplied to the evaluated circuit in response to the oscillation frequency of the switching current dependent oscillator if selecting to apply the dynamic voltage and frequency scaling technique.

Figure 4:
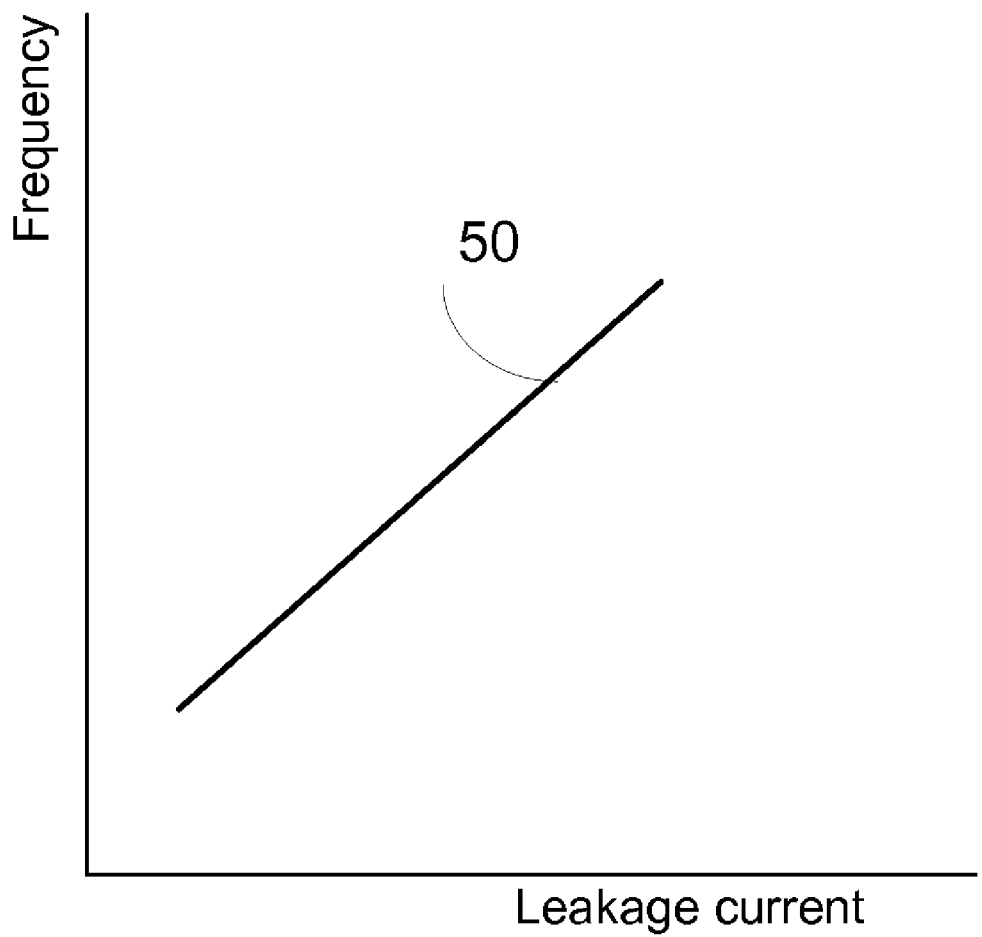
FIG. 4 schematically shows an example of an embodiment of a relationship between an oscillation frequency of a leakage current dependent oscillator and an leakage power of an evaluated circuit.

Power reduction module 340 can perform a calibration state during which it maps the oscillating frequency of leakage current dependent oscillator 320 to a leakage current of evaluated circuit 310. FIG. 4 is a non limiting example of a linear relationship (illustrated by curve 50) between the oscillating frequency of leakage current dependent oscillator 320 to a leakage current of evaluated circuit 310. Additionally or alternatively, such information can be provided to power reduction module 340.

Figure 5:
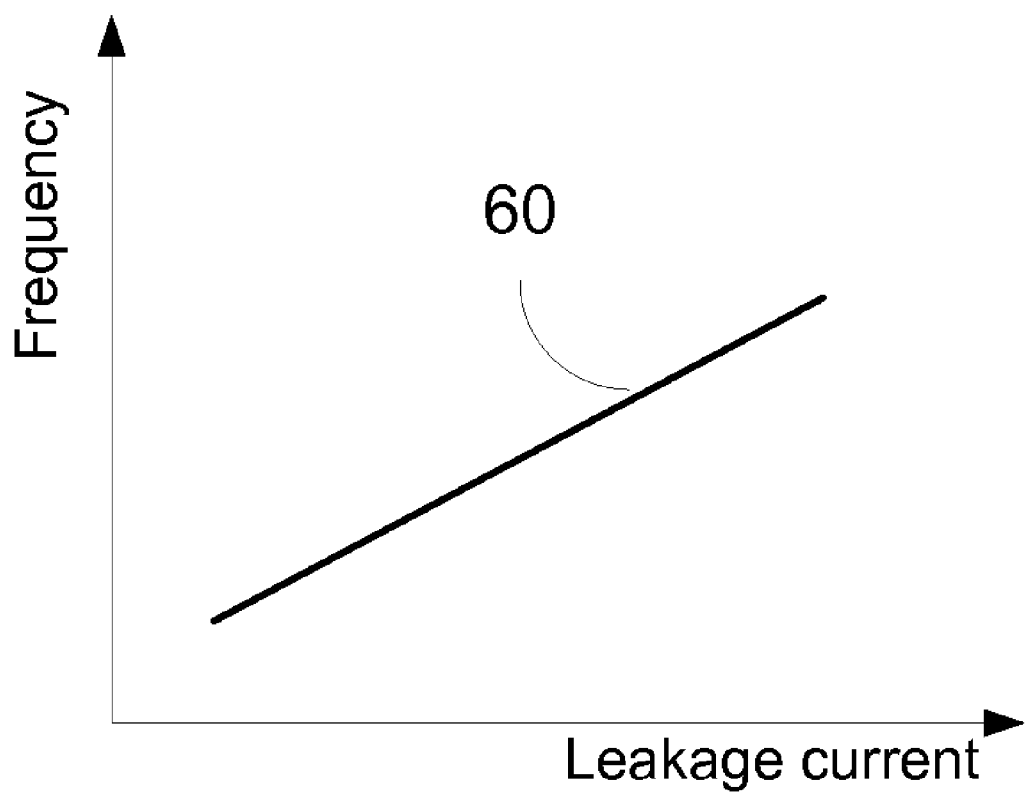
FIG. 5 schematically shows an example of an embodiment of a relationship between an oscillation frequency of a switching current dependent oscillator and an switching power of an evaluated circuit.

Power reduction module 340 can perform a calibration state during which it maps the oscillating frequency of switching current dependent oscillator 330 to a switching current of evaluated circuit 310. FIG. 5 is a non limiting example of a linear relationship (illustrated by curve 60) between the oscillating frequency of switching current dependent oscillator 330 to a switching current of evaluated circuit 310. Additionally or alternatively, such information can be provided to power reduction module 340.

The oscillating frequency of leakage current dependent oscillator 320 strongly depends upon the temperature of device 300. For example, the ratio between the oscillation frequencies of the leakage current dependent oscillator 320 at about 25 degrees Celsius and at about 20 degrees Celsius can exceed ten. Yet for another example, the ratio between the oscillation frequencies of the leakage current dependent oscillator 320 at about 105 degrees Celsius and at about 20 degrees Celsius can exceed four hundred. The oscillating frequency of leakage current dependent oscillator 320 can slightly change in response to changes in the supply voltage.

The oscillating frequency of switching current dependent oscillator 330 is almost robust to temperature changes of device 300. The oscillation frequencies of the switching current dependent oscillator 330 remain substantially the same within a temperature range of about 20 to 105 degrees Celsius. On the other hand, there can be a linear ratio between the voltage supply and the oscillating frequency of switching current dependent oscillator 330. For example—the ratio between the oscillation frequencies of the switching current dependent oscillator 330 at supply voltages of 1.2 volts and 0.8 volts can exceed six.

Power reduction module 340 can be configured to: (i) change a voltage supplied to the leakage current dependent oscillator and to the switching current dependent oscillator; (ii) compare between the oscillation frequency of the leakage current dependent oscillator and the oscillation frequency of the switching current dependent oscillator, to provide a next comparison result; and (iii) select the power reduction technique in response to the current comparison result and to the next comparison result.

A decision to change the selected power reduction technique can include changing the supply voltage provided to oscillators 320 and 330. The change can include increasing the supply voltage and measuring the oscillation frequencies of oscillators 320 and 330, and the decreasing the voltage and measuring the oscillation frequencies of oscillators 320 and 330.

Power reduction module 340 can perform the following: (i) increase a voltage supplied to oscillators 320 and 330; (ii) compare between the oscillation frequency of oscillators 320 and 330 to provide an increased voltage comparison result; (iii) decrease a voltage supplied to oscillators 320 and 330; (iv) compare between the oscillation frequency of oscillators 320 and 330 to provide a decreased voltage comparison result; and (v) select a power reduction technique in response to the current comparison result, the increased voltage comparison result and the decreased voltage comparison result.

The change of the supply voltage provided to oscillators 320 and 330 can be done according to a predefined schedule, and additionally or alternatively, in response to occurrence of an event. For example, the change can be triggered at predefined points (for example—after a predetermined period lapses from a last change of the voltage supplied to an oscillator). Yet for another example—these changes can be triggered as a response in a change of the temperature of the evaluated circuit 310. The temperature change can be measured by circuit 300 or can be estimated in various manners. The temperature change estimation can be based upon changes in the oscillating frequency of leakage current dependent oscillator 320.

Power reduction module 340 can select a power reduction technique out of a dynamic voltage and frequency scaling technique, a power gating technique and a combination of power gating and dynamic voltage and frequency scaling technique. A combination of these power reduction techniques can include shutting down evaluated circuit 310 during idle periods. Additionally or alternatively, shutting down evaluation circuit 310 instead of providing the lowest voltage supply level.

Power reduction module 340 can select the DVFS technique when the dynamic power consumption is more dominant than the leakage power consumption. This elative domination is reflected by the relationship between the oscillating frequencies of oscillators 320 and 330. For example, power reduction module 340 it can select the DVFS technique if the oscillation frequency of leakage current dependent oscillator 320 is less than two thirds (or less than a half) of the oscillation frequency of switching current dependent oscillator 330.

Figure 6:
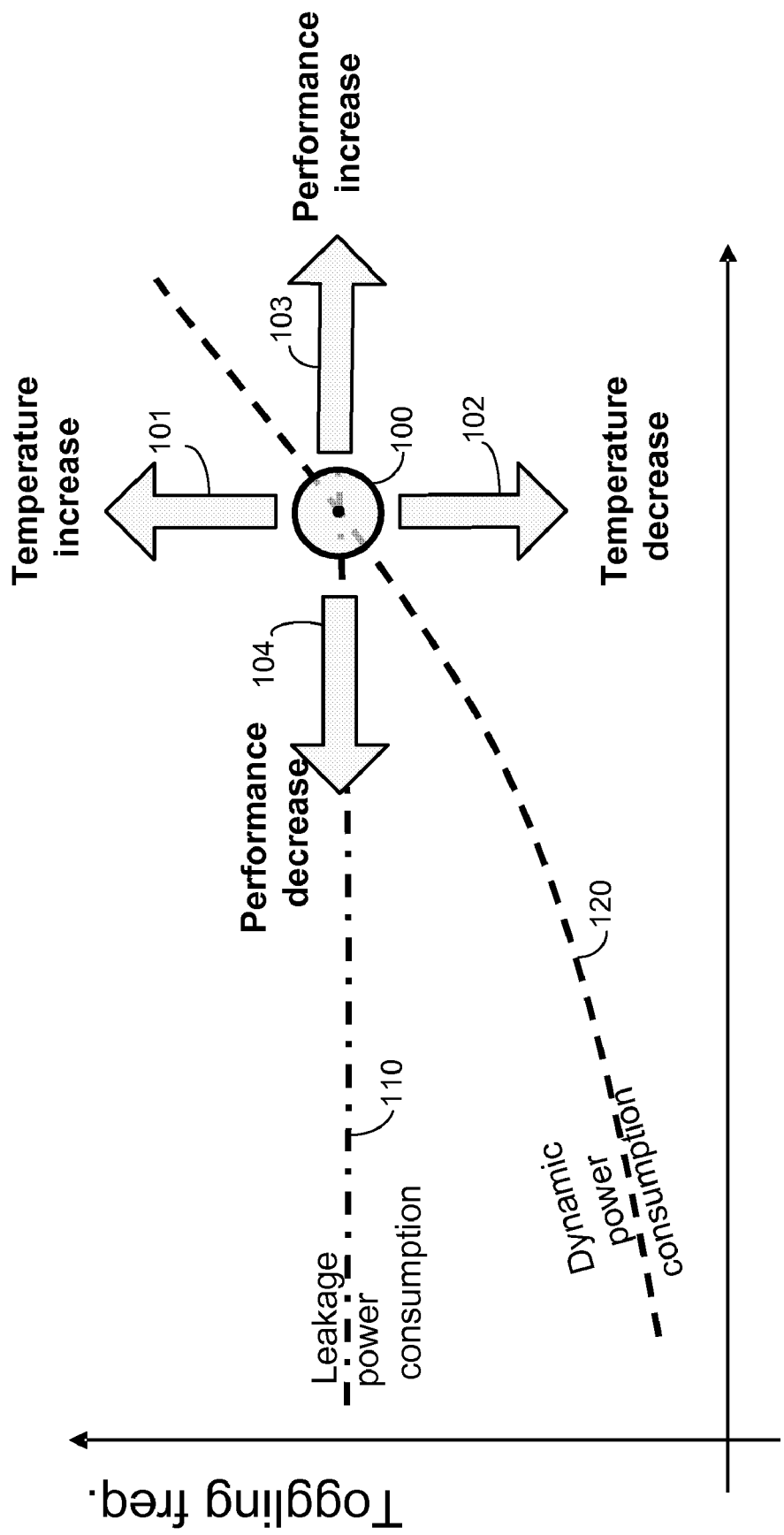
FIG. 6 schematically shows an example of an embodiment of a relationship between an oscillation frequency of a switching current dependent oscillator, an oscillation frequency of a leakage current dependent oscillator, temperature changes and supply voltage.

FIG. 6 schematically shows an example of an embodiment of a relationship between an oscillation frequency of switching current dependent oscillator 330, an oscillation frequency of leakage current dependent oscillator 320, temperature changes and supply voltage.

Horizontal curve 110 illustrates the oscillating frequency of leakage current dependent oscillator 320 over a range of supply voltages (provided to leakage current dependent oscillator 320). Non-linear incrementing curve 120 illustrates the oscillating frequency of switching current dependent oscillator 330 over a range of supply voltages (provided to switching current dependent oscillator 330). The oscillating frequency of oscillator 320 will rise when the temperature increases and will drop when the temperature decreases. In addition the oscillating frequency of oscillator 330 will increase when the supply voltage is increased and will decrease when the supply voltage decreases. These phenomena are illustrated by crossing point 100 and arrows 101, 102, 103 and 104. Crossing point 100 is the crossing point of curves 110 and 120. It can "move" in response to temperature increments (arrow 101), temperature decrement (arrow 102), voltage increments (arrow 103) and voltage decrement (arrow 104).

Figure 7:
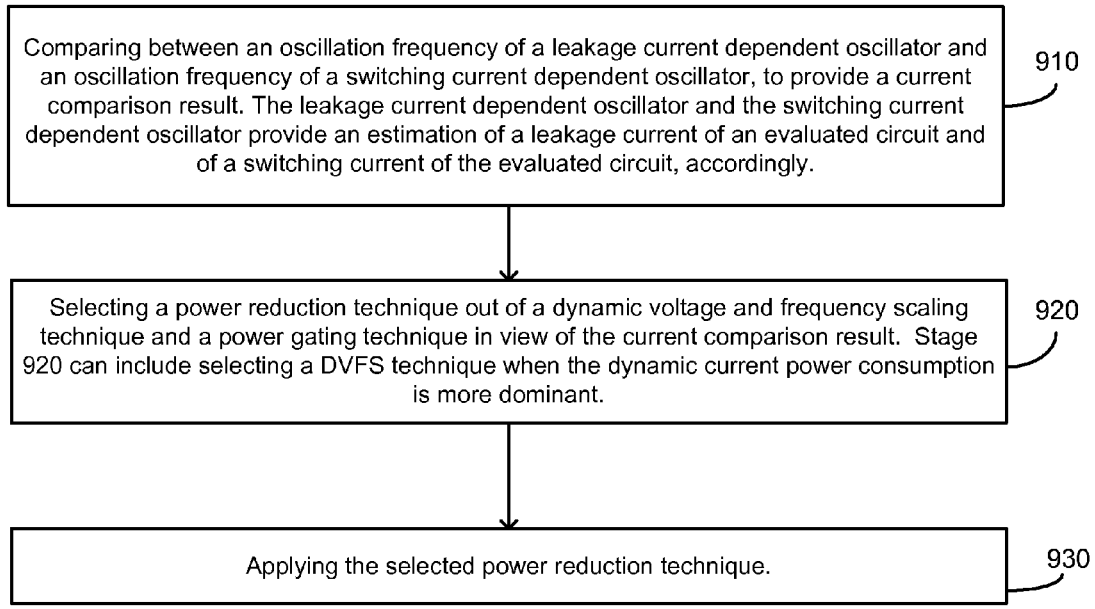
FIG. 7 schematically shows an example of an embodiment of a method.

FIG. 7 schematically shows an example of an embodiment of method 900.

Method 900 starts by stage 910 of comparing between an oscillation frequency of a leakage current dependent oscillator and an oscillation frequency of a switching current dependent oscillator, to provide a current comparison result. The leakage current dependent oscillator and the switching current dependent oscillator provide an estimation of a leakage current of an evaluated circuit and of a switching current of the evaluated circuit, accordingly.

Stage 910 is followed by stage 920 of selecting a power reduction technique out of a dynamic voltage and frequency scaling technique and a power gating technique in view of the current comparison result. Stage 920 can include selecting a DVFS technique when the dynamic current power consumption is more dominant.

Stage 920 can include determining a level of a voltage supplied to the evaluated circuit in response to the oscillation frequency of the switching current dependent oscillator if selecting to apply the DVFS scaling technique. The selection can be responsive to the relationships between the oscillating frequencies of the different oscillators (that reflect the relationships between the leakage and switching power consumptions of an evaluated circuit).

Stage 920 is followed by stage 930 of applying the selected power reduction technique.

Method 900 can be implemented by power reduction module 340 of FIG. 3.

Figure 8:
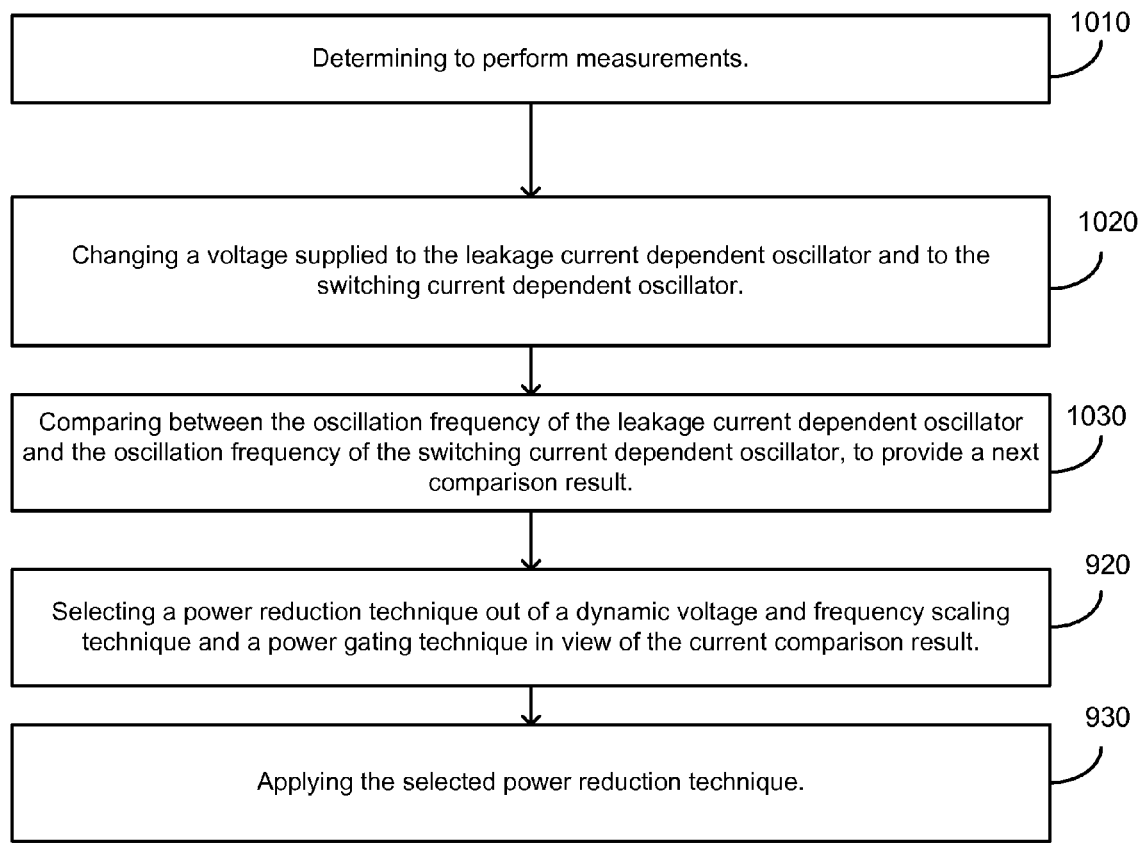
FIG. 8 schematically shows an example of an embodiment of a method.

FIG. 8 schematically shows an example of an embodiment of method 1000.

Method 1000 starts by stage 1010 of determining to perform measurements.

Stage 1010 is followed by stage 1020 of changing a voltage supplied to the leakage current dependent oscillator and to the switching current dependent oscillator.

Stage 1020 is followed by stage 1030 of comparing between the oscillation frequency of the leakage current dependent oscillator and the oscillation frequency of the switching current dependent oscillator, to provide a next comparison result.

Stage 1030 is followed by stage 920 of selecting a power reduction technique out of a dynamic voltage and frequency scaling technique and a power gating technique in view of the current comparison result. Stage 920 is followed by stage 930 of applying the selected power reduction technique.

Stage 1010 can be responsive to a lapse of a predetermined period from a last change of voltage supplied to the leakage current dependent oscillator.

Stage 1010 can be responsive to a change in temperature.

Stage 1010 can include applying a predetermined measurement scheme. Additionally or alternatively, stage 1010 can be responsive to a change of oscillating frequency (for example—a change that exceeds a predefined value) of a leakage current dependent oscillator.

Stage 1020 can be executed without changing the voltage supplied to the evaluated circuit.

Stages 1020 and 1030 can be repeated multiple times before continuing to stage 920. For example, in a first iteration stage 1020 can include increasing a voltage supplied to the leakage current dependent oscillator and to the switching current dependent oscillator and stage 1030 can include comparing between the oscillation frequency of the leakage current dependent oscillator and the oscillation frequency of the switching current dependent oscillator, to provide an increased voltage comparison result. In another iteration stage 1020 can include decreasing a voltage supplied to the leakage current dependent oscillator and to the oscillation frequency of a switching current dependent oscillator and stage 1030 includes comparing between the oscillation frequency of the leakage current dependent oscillator and to the switching current dependent oscillator, to provide a decreased voltage comparison result. After these iterations stage 920 can include selecting a power reduction technique in response to the current comparison result, the increased voltage comparison result and the decreased voltage comparison result.

Figure 9:
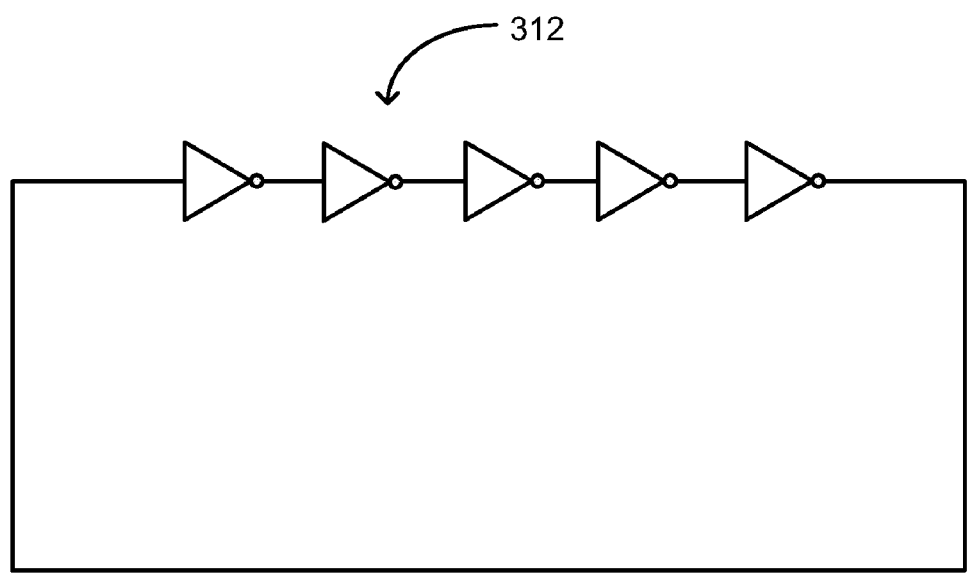
FIG. 9 schematically shows an example of an switching current dependent oscillator.

FIG. 9 schematically shows an example of switching current dependent oscillator 330. Switching current dependent oscillator 330 includes a ring oscillator that includes an even number of inverters 312 that resemble (or even equals to the inventers of evaluated circuit 310.

Figure 10:
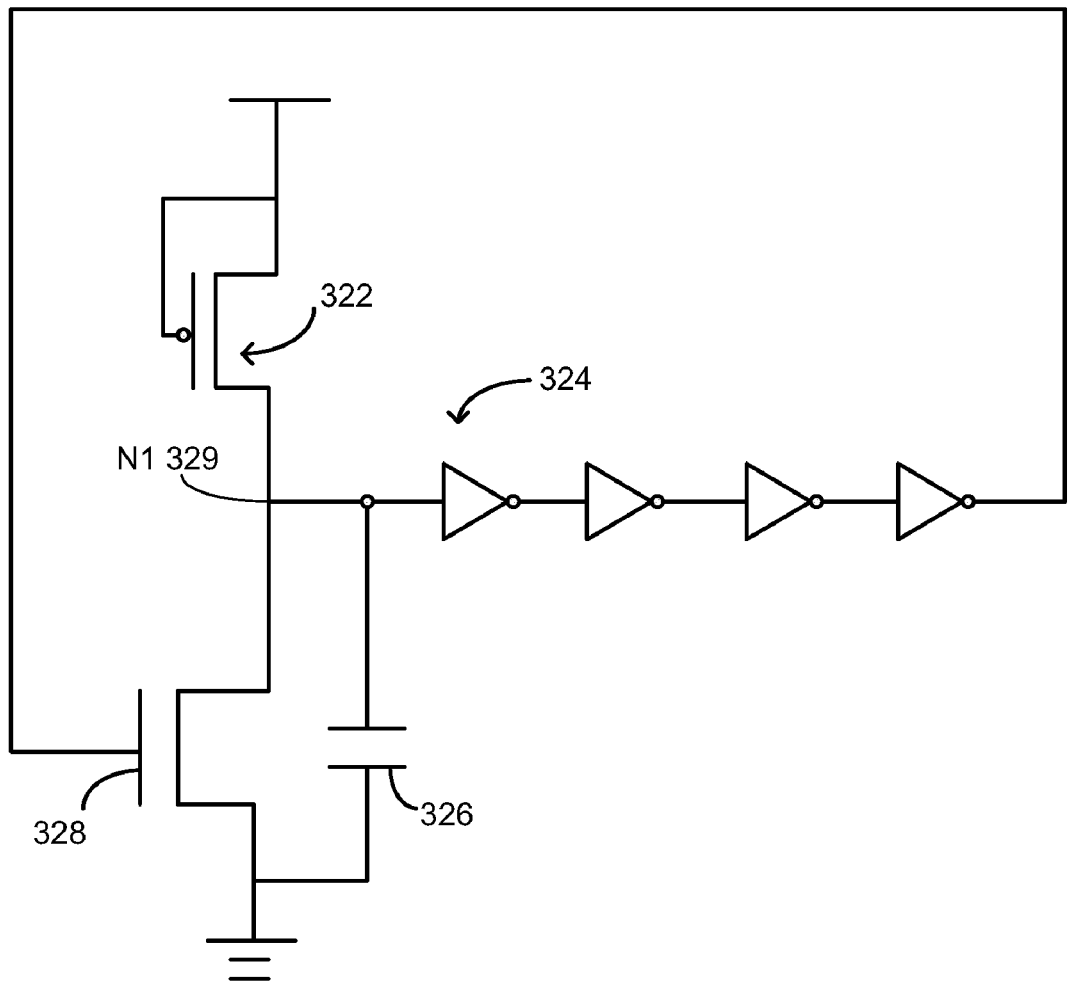
FIG. 10 schematically shows an example of a leakage current dependent oscillator.

FIG. 10 schematically shows an example of leakage current dependent oscillator 320. Leakage current dependent oscillator 320 includes a large transistor 322 that has its source and gate shorted so that a leakage current flows through it towards a sequence of inverters 324 and capacitor 326. The output of the sequence of inverters 324 is connected to the gate of a transistor 328 that is connected in parallel to capacitor 326. The source of large transistor 322, the input of sequence of inverters 324, one end of capacitor 326 and the source of transistor 328 are connected to node N1 329. The other end of capacitor 326 and the drain of transistor 328 are grounded.

The leakage current of large transistor 322 charges capacitor 326 while transistor 328 shorts it to the ground. The charge period is determined by the leakage current of large transistor 322.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

In addition, the invention is not limited to physical devices or units implemented in non-programmable hardware but can also be applied in programmable devices or units able to perform the desired device function by operating in accordance with suitable program code. Furthermore, the devices may be physically distributed over a number of apparatuses, while functionally operating as a single device.

However, other modifications, variations, and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps from those listed in a claim. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. A method for power reduction, the method comprising:
   comparing between an oscillation frequency of a leakage current dependent oscillator and an oscillation frequency of a switching current dependent oscillator, to provide a current comparison result; wherein the leakage current dependent oscillator and the switching current dependent oscillator provide an estimation of a leakage current of an evaluated circuit and of a switching current of the evaluated circuit, accordingly;
   selecting a power reduction technique out of a dynamic voltage and frequency scaling technique, and a power gating technique in view of the current comparison result;
   applying the selected power reduction technique; and
   determining a level of a voltage supplied to the evaluated circuit in response to the oscillation frequency of the switching current dependent oscillator if selecting to apply the dynamic voltage and frequency scaling technique.

2. The method according to claim 1 comprising selecting the power reduction technique out of the dynamic voltage and frequency scaling technique, the power gating technique, and a combination of the power gating technique and the dynamic voltage and frequency scaling technique.

3. A method for power reduction, the method comprising:
   comparing between an oscillation frequency of a leakage current dependent oscillator and an oscillation frequency of a switching current dependent oscillator, to provide a current comparison result; wherein the leakage current dependent oscillator and the switching current dependent oscillator provide an estimation of a leakage current of an evaluated circuit and of a switching current of the evaluated circuit, accordingly;
   selecting a power reduction technique out of a dynamic voltage and frequency scaling technique, and a power gating technique in view of the current comparison result;
   applying the selected power reduction technique;
   changing a voltage supplied to the leakage current dependent oscillator and to the switching current dependent oscillator;
   comparing between the oscillation frequency of the leakage current dependent oscillator and the oscillation frequency of the switching current dependent oscillator, to provide a next comparison result; and
   wherein the selecting is responsive to the current comparison result and the next comparison result.

4. The method according to claim 3 wherein the changing is triggered by a lapse of a predetermined period from a last change of the voltage supplied to the leakage current dependent oscillator.

5. The method according to claim 3 wherein the changing is triggered by a change in temperature.

6. The method according to claim 3 comprising determining a voltage supplied to the evaluation circuit regardless of the changing of the voltage supplied to the leakage current dependent oscillator and to the switching current dependent oscillator.

7. A method for power reduction, the method comprising:
   comparing between an oscillation frequency of a leakage current dependent oscillator and an oscillation frequency of a switching current dependent oscillator, to provide a current comparison result; wherein the leakage current dependent oscillator and the switching current dependent oscillator provide an estimation of a leakage current of an evaluated circuit and of a switching current of the evaluated circuit, accordingly;
   selecting a power reduction technique out of a dynamic voltage and frequency scaling technique, and a power gating technique in view of the current comparison result;
   applying the selected power reduction technique;
   increasing a voltage supplied to the leakage current dependent oscillator and to the switching current dependent oscillator;
   comparing between the oscillation frequency of the leakage current dependent oscillator and the oscillation frequency of the switching current dependent oscillator, to provide an increased voltage comparison result;

decreasing the voltage supplied to the leakage current dependent oscillator and to the switching current dependent oscillator;

comparing between the oscillation frequency of the leakage current dependent oscillator and to the switching current dependent oscillator, to provide a decreased voltage comparison result; and wherein the selecting is responsive to the current comparison result, the increased voltage comparison result and the decreased voltage comparison result.

8. A method for power reduction, the method comprising:
comparing between an oscillation frequency of a leakage current dependent oscillator and an oscillation frequency of a switching current dependent oscillator, to provide a current comparison result; wherein the leakage current dependent oscillator and the switching current dependent oscillator provide an estimation of a leakage current of an evaluated circuit and of a switching current of the evaluated circuit, accordingly;

selecting a power reduction technique out of a dynamic voltage and frequency scaling technique, and a power gating technique in view of the current comparison result if the oscillation frequency of the leakage current dependent oscillator is less than a half of the oscillation frequency of the switching current dependent oscillator; and applying the selected power reduction technique.

9. A method for power reduction, the method comprising:
comparing between an oscillation frequency of a leakage current dependent oscillator and an oscillation frequency of a switching current dependent oscillator, to provide a current comparison result; wherein the leakage current dependent oscillator and the switching current dependent oscillator provide an estimation of a leakage current of an evaluated circuit and of a switching current of the evaluated circuit, accordingly;

selecting a power reduction technique out of a dynamic voltage and frequency scaling technique, and a power gating technique in view of the current comparison result if the oscillation frequency of the leakage current dependent oscillator is less than two thirds of the oscillation frequency of the switching current dependent oscillator; and applying the selected power reduction technique.

10. A device, comprising:
an evaluated circuit;
a leakage current dependent oscillator configured to generate an oscillating signal that has an oscillating frequency that represents a leakage current of the evaluated circuit;
a switching current dependent oscillator configured to generate an oscillating signal that has an oscillating frequency that represents a switching induced current of the evaluated circuit; and
a power reduction module that is configured to:
compare between the oscillating frequency of the leakage current dependent oscillator and the oscillating frequency of the switching current dependent oscillator, to provide a current comparison result;
select a power reduction technique out of a dynamic voltage and frequency scaling technique, and a power gating technique in view of the current comparison result; and
apply the selected power reduction technique;
wherein the power reduction module is configured to determine a level of a voltage supplied to the evaluated circuit in response to the oscillating frequency of the switching current dependent oscillator if selecting to apply the dynamic voltage and frequency scaling technique.

11. The device according to claim 10, wherein the power reduction module is configured to select the dynamic voltage and frequency scaling technique, the power gating technique, and a combination of the power gating technique and the dynamic voltage and frequency scaling technique.

12. A device, comprising:
an evaluated circuit;
a leakage current dependent oscillator configured to generate an oscillating signal that has an oscillating frequency that represents a leakage current of the evaluated circuit;
a switching current dependent oscillator configured to generate an oscillating signal that has an oscillating frequency that represents a switching induced current of the evaluated circuit; and
a power reduction module that is configured to:
compare between the oscillating frequency of the leakage current dependent oscillator and the oscillating frequency of the switching current dependent oscillator, to provide a current comparison result;
select a power reduction technique out of a dynamic voltage and frequency scaling technique, and a power gating technique in view of the current comparison result; and
apply the selected power reduction technique;
wherein the power reduction module is configured to:
change a voltage supplied to the leakage current dependent oscillator and to the switching current dependent oscillator;
compare between the oscillating frequency of the leakage current dependent oscillator and the oscillating frequency of the switching current dependent oscillator, to provide a next comparison result; and
select the power reduction technique in response to the current comparison result and to the next comparison result.

13. The device according to claim 12 wherein the power reduction module is configured to change the voltage supplied to the leakage current dependent oscillator and to the switching current dependent oscillator after a predetermined period lapses from a last change of voltage supplied to the leakage current dependent oscillator.

14. The device according to claim 12 wherein the power reduction module is configured to change the voltage supplied to the leakage current dependent oscillator and to the switching current dependent oscillator in response to a change in temperature.

15. The device according to claim 12 wherein the power reduction module is configured to determine a voltage supplied to the evaluation circuit regardless of the change of the voltage supplied to the leakage current dependent oscillator and to the switching current dependent oscillator.

16. A device, comprising:
an evaluated circuit;
a leakage current dependent oscillator configured to generate an oscillating signal that has an oscillating frequency that represents a leakage current of the evaluated circuit;
a switching current dependent oscillator configured to generate an oscillating signal that has an oscillating frequency that represents a switching induced current of the evaluated circuit; and
a power reduction module that is configured to:

compare between the oscillating frequency of the leakage current dependent oscillator and the oscillating frequency of the switching current dependent oscillator, to provide a current comparison result;

select a power reduction technique out of a dynamic voltage and frequency scaling technique, and a power gating technique in view of the current comparison result; and apply the selected power reduction technique;

wherein the power reduction module is configured to:
increase a voltage supplied to the leakage current dependent oscillator and to the switching current dependent oscillator;

compare between the oscillating frequency of the leakage current dependent oscillator and the oscillating frequency of the switching current dependent oscillator, to provide an increased voltage comparison result;

decrease the voltage supplied to the leakage current dependent oscillator and to the switching current dependent oscillator;

compare between the oscillating frequency of the leakage current dependent oscillator and the oscillating frequency of the switching current dependent oscillator, to provide a decreased voltage comparison result; and wherein the selection is responsive to the current comparison result, the increased voltage comparison result and the decreased voltage comparison result.

17. A device, comprising:

an evaluated circuit;

a leakage current dependent oscillator configured to generate an oscillating signal that has an oscillating frequency that represents a leakage current of the evaluated circuit;

a switching current dependent oscillator configured to generate an oscillating signal that has an oscillating frequency that represents a switching induced current of the evaluated circuit; and a power reduction module that is configured to:
compare between the oscillating frequency of the leakage current dependent oscillator and the oscillating frequency of the switching current dependent oscillator, to provide a current comparison result;

select a power reduction technique out of a dynamic voltage and frequency scaling technique, and a power gating technique in view of the current comparison result if the oscillating frequency of the leakage current dependent oscillator is less than a half of the oscillating frequency of the switching current dependent oscillator; and apply the selected power reduction technique.

18. A device, comprising:

an evaluated circuit;

a leakage current dependent oscillator configured to generate an oscillating signal that has an oscillating frequency that represents a leakage current of the evaluated circuit;

a switching current dependent oscillator configured to generate an oscillating signal that has an oscillating frequency that represents a switching induced current of the evaluated circuit; and a power reduction module that is configured to:
compare between the oscillating frequency of the leakage current dependent oscillator and the oscillating frequency of the switching current dependent oscillator, to provide a current comparison result;

select a power reduction technique out of a dynamic voltage and frequency scaling technique, and a power gating technique in view of the current comparison result if the oscillating frequency of the leakage current dependent oscillator is less than two thirds of the oscillating frequency of the switching current dependent oscillator; and apply the selected power reduction technique.

* * * * *

UNITED STATES PATENT AND TRADEMARK OFFICE
CERTIFICATE OF CORRECTION

| | | |
|---|---|---|
| PATENT NO. | : 8,049,550 B2 | Page 1 of 1 |
| APPLICATION NO. | : 12/208145 | |
| DATED | : November 1, 2011 | |
| INVENTOR(S) | : Anton Rozen et al. | |

It is certified that error appears in the above-identified patent and that said Letters Patent is hereby corrected as shown below:

Column 10, Line 5, please change "select the dynamic voltage" to --select the power reduction technique out of the dynamic voltage--

Signed and Sealed this
Seventh Day of February, 2012

David J. Kappos
*Director of the United States Patent and Trademark Office*